(12) United States Patent
Park

(10) Patent No.: US 10,825,390 B2
(45) Date of Patent: Nov. 3, 2020

(54) DISPLAY PANEL INCLUDING DRIVE CIRCUIT AND IMAGE DISPLAY DEVICE USING THE SAME

(71) Applicant: LG DISPLAY CO., LTD., Seoul (KR)

(72) Inventor: Jaehoon Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/226,569

(22) Filed: Dec. 19, 2018

(65) Prior Publication Data

US 2019/0213952 A1 Jul. 11, 2019

(30) Foreign Application Priority Data

Dec. 29, 2017 (KR) .......................... 10-2017-0184049

(51) Int. Cl.
| | |
|---|---|
| *G09G 3/3233* | (2016.01) |
| *G09G 3/3291* | (2016.01) |
| *G09G 3/3266* | (2016.01) |
| *H01L 27/32* | (2006.01) |
| *H01L 29/786* | (2006.01) |

(52) U.S. Cl.
CPC ......... *G09G 3/3233* (2013.01); *G09G 3/3266* (2013.01); *G09G 3/3291* (2013.01); *H01L 27/3276* (2013.01); *G09G 2300/0408* (2013.01); *G09G 2300/0426* (2013.01); *G09G 2300/0809* (2013.01); *G09G 2310/0286* (2013.01); *G09G 2310/08* (2013.01); *H01L 29/7869* (2013.01); *H01L 29/78672* (2013.01)

(58) Field of Classification Search
CPC .. G09G 3/3233; G09G 3/3291; G09G 3/3266; G09G 2300/0408; G09G 2300/0809; G09G 2300/0426; G09G 2310/08; G09G 2310/0286; G09G 3/20; G09G 3/3208; H01L 27/3276; H01L 29/78672; H01L 29/7869; H01L 27/1222; G11C 19/28

See application file for complete search history.

(56) References Cited

U.S. PATENT DOCUMENTS

| | | | |
|---|---|---|---|
| 2011/0279418 A1* | 11/2011 | Han | G02F 1/136286 345/204 |
| 2013/0056726 A1* | 3/2013 | Chae | H01L 27/3276 257/43 |
| 2016/0079331 A1* | 3/2016 | Hwang | G09G 3/3233 257/40 |
| 2016/0182042 A1* | 6/2016 | Kim | G09G 3/2092 345/213 |
| 2017/0162145 A1* | 6/2017 | Huang | G02F 1/1368 |

* cited by examiner

*Primary Examiner* — Brent D Castiaux
(74) *Attorney, Agent, or Firm* — Polsinelli PC

(57) ABSTRACT

A display panel including a drive circuit and an image display device using the same are disclosed. The display panel provided with a drive circuit includes a substrate, a plurality of clock lines and a link line, a plurality of switching elements, a plurality of insulation layers, and an image display surface. The clock lines and link line are formed in a link line unit on the substrate. The switching elements are formed in a gate drive circuit region on the substrate. The insulation layers include the plurality of clock lines, the link line, and the plurality of switching elements. The image display surface includes a plurality of sub-pixels formed over the entire surface of the plurality of insulation layers such that an image is displayed thereon.

21 Claims, 5 Drawing Sheets

DISPLAY PANEL INCLUDING DRIVE CIRCUIT AND IMAGE DISPLAY DEVICE USING THE SAME

CROSS-REFERENCE TO RELATED APPLICATIONS

This application claims the priority of Korean Patent Application No. 10-2017-0184049 filed on Dec. 29, 2017, which is hereby incorporated by reference in its entirety.

BACKGROUND

Field of the Disclosure

The present disclosure relates to a display device, and more particularly to a display panel including a drive circuit, and an image display device using the same. Although the present disclosure is suitable for a wide scope of applications, it is particularly suitable for minimizing a non-display region and a bezel region of the image display panel.

Description of the Background

With the rapid development of information-oriented society, demand for display devices displaying images has been gradually increasing in various fields. In recent times, various flat display devices, such as a liquid crystal display (LCD), an organic light emitting diode (OLED) display, and the like, have been developed and rapidly come into being commercialized.

As a representative method for improving an image quality or an image display efficiency of the flat display device, many technologies for relatively expanding an image display region by reducing the size of a bezel have recently been proposed. For example, a gate in panel (GIP) scheme is one of such technologies proposed by the aforementioned objectives or the like, and the GIP scheme refers to a technology for embedding a gate drive circuit driving gate lines of an image display panel into one side region of an image display region, such that the gate drive circuit is embedded in the image display region.

However, a plurality of thin film transistors (TFTs) constructed in the gate drive circuit is generally designed to occupy a larger region as compared to TFTs formed in respective pixels of the image display region. In addition, it is necessary for many more TFTs to be constructed to improve reliability of respective control signals.

Specifically, as a resolution of the image display panel gradually increases, an integration degree of the pixels is also increasing. As the integration degree of the respective pixels increases, the region of the gate drive circuit should be further enlarged to maintain a design region of many more TFTs.

Therefore, the present disclosure provides a new method for reducing a region needed to construct a GIP-based gate driver and minimizing the size of the region, such that the present disclosure is to provide an image display panel having a much reduced bezel or a zero-bezel type image display panel, and an image display device using the same.

SUMMARY

Therefore, the present disclosure has been made in view of the above problems and is to provide a display panel including a drive circuit and an image display device using the same. In accordance with the display panel and the image display device using the same, a gate drive circuit for driving gate lines of an image display panel is composed of LTPS (Low Temperature Poly Silicon) TFTs, and the gate drive circuit is embedded into an internal insulation layer and a low temperature polysilicon (LTPS) layer of an image display region. Image display pixels are arranged and constructed over the entire surfaces of the internal insulation layer and the LTPS layer in a manner that the image display pixels overlap the internal insulation layer and the LTPS layer in which the gate drive circuit is embedded, such that a non-display region and a bezel region of the image display panel can be reduced to eliminated.

The present disclosure is not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

Various aspects of the present disclosure are directed to providing a display panel including a drive circuit and an image display device using the same that substantially obviate one or more problems due to limitations and disadvantages of the related art.

In accordance with one aspect of the present disclosure, a display panel provided with a drive circuit includes a substrate; a plurality of clock lines and a link line formed in a link line unit on the substrate; a plurality of switching elements formed in a gate drive circuit region on the substrate; a plurality of insulation layers configured to include the plurality of clock lines, the link line, and the plurality of switching elements; and an image display surface configured to include a plurality of sub-pixels formed over an entire surface of the plurality of insulation layers such that an image is displayed thereon.

In accordance with another aspect of the present disclosure, an image display device includes: a display panel configured to include a front-directional image display surface on which gate and data lines are arranged to cross each other, a plurality of sub-pixels formed in intersection regions of the gate and data lines to display an image thereon, and a gate drive circuit formed in the image display surface to drive the gate lines; a drive integrated circuit configured to transmit a gate control signal for controlling the gate drive circuit to the gate drive circuit, and transmit a data voltage to the data lines; and a power-supply unit configured to supply high-potential and low-potential drive voltages to the sub-pixels of the image display surface, the gate drive circuit, and the drive integrated circuit.

In a further aspect of the present disclosure, A display device including a display panel displaying an image on an image display side includes a plurality of gate lines and a plurality of data lines cross each other; a plurality of sub-pixels disposed at intersection regions of the gate and data lines; a plurality of clock lines and a link line disposed at a link line unit; a shift register configured to generate and output a plurality of scan signals sequentially driving the plurality of gate lines upon receiving a gate control signal and a plurality of clock pulses transmitted through the plurality of clock lines and the link line; and a light emission control register configured to generate and output a plurality of light emission control signals driving emission lines of the image display side upon receiving the gate control signal and the plurality of clock pulses transmitted through the plurality of clock lines and the link line. a plurality of insulation layers covering the plurality of clock lines, the link line, the shift register and light emission control register; and a power supply unit supplying high-potential and low-potential drive voltages to the plurality of sub-pixels and the shift register and light emission control register, wherein the plurality of clock lines, the link line and the shift register and light emission control register vertically overlap one another.

BRIEF DESCRIPTION OF DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
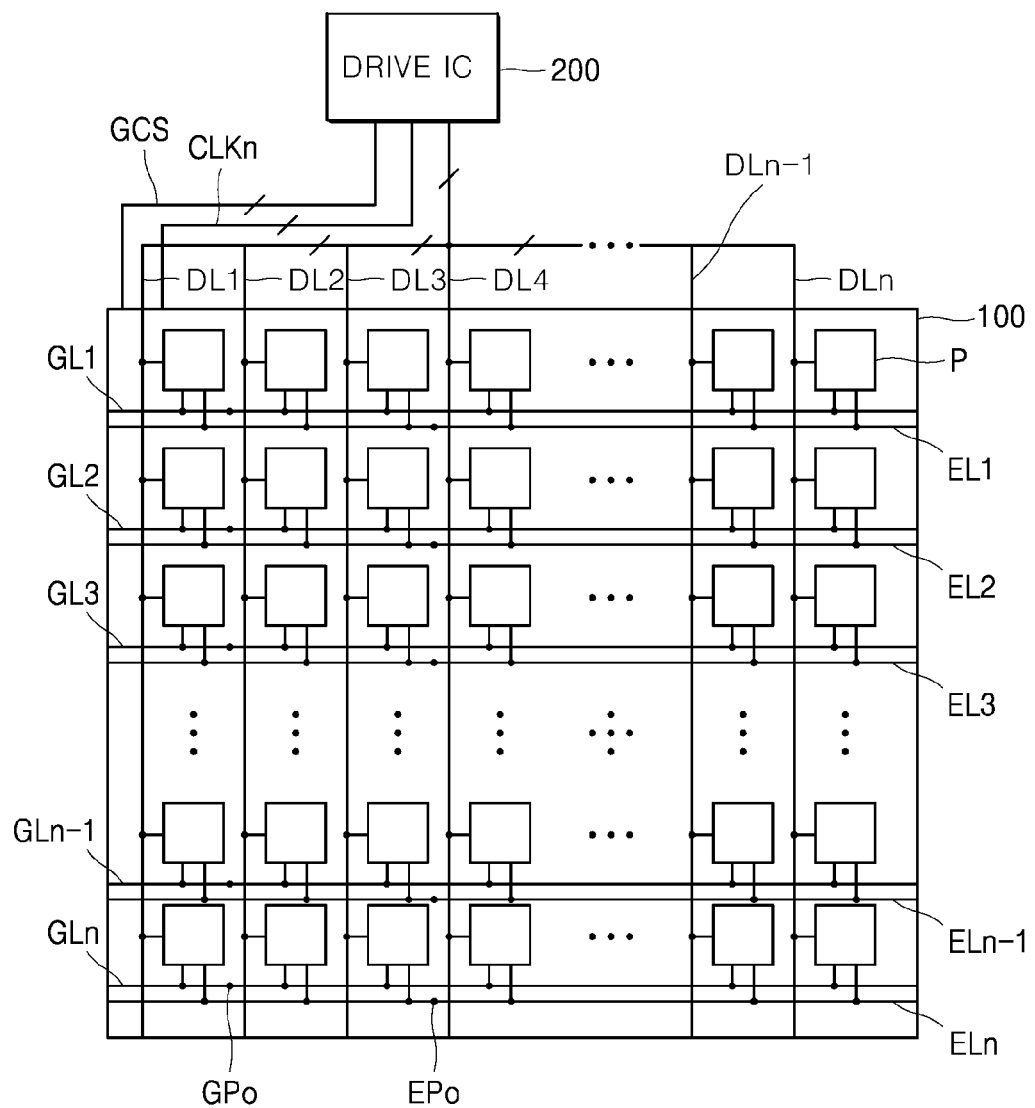
FIG. 1 is a schematic view illustrating a display panel including a drive circuit and an image display device including the same according to an aspect of the present disclosure.

The features and advantages will become apparent from the detailed description with reference to the accompanying drawings. Aspects are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, aspects of the present disclosure will be described in detail with reference to the accompanying drawings. Throughout the drawings, like reference numerals refer to like elements.

Reference will now be made in detail to certain aspects, examples of which are illustrated in the accompanying drawings. Prior to description, the terms or words used in the disclosure and the claims are not interpreted as having general meanings or dictionary meanings, but should be interpreted as having meanings and concepts coinciding with the technical scope and sprit of the present disclosure based on the principle in that an inventor may properly define the concept of terms to describe the present disclosure in the best mode. Therefore, the aspects described in the specification and shown in the drawings are purely illustrative and are not intended to represent all aspects of the invention, such that various equivalents and modifications may be made without departing from the spirit of the invention.

A display panel including a drive circuit and an image display device using the same according to the aspects of the present disclosure will hereinafter be described with reference to the attached drawings.

The image display devices to which the principal technologies of the present disclosure are applied may include, for example, a liquid crystal display (LCD), a field emission display (FED), an organic light emitting diode (OLED) display, a quantum dot display (QDD), etc.

For convenience of description and better understanding of the present disclosure, the image display device of the present disclosure will hereinafter be described using the OLED display.

FIG. 1 is a schematic view illustrating a display panel including a drive circuit and an image display device including the same according to an aspect of the present disclosure.

Referring to FIG. 1, an OLED display may include a display panel 100, a drive integrated circuit (IC) 200 and a power supply unit (not shown).

The display panel 100 may include a plurality of gate lines (GL1~GLn) and a plurality of data lines (DL1~DLn) which are arranged to cross each other on a front-directional image display surface. Sub-pixels (P) are formed in intersection regions of the gate and data lines (GL1~GLn and DL1~DLn), thereby displaying images. In this case, a gate drive circuit for driving the gate lines (GL1~GLn) may be embedded into an interior part of a back surface of the image display surface on which images are displayed.

Sub-pixels (P) for displaying images through light emission of organic light emitting diodes (OLEDs) may include emission lines (EL1~ELn) to which a light-emission control signal for controlling an OLED light emission time period is supplied. The gate drive circuit embedded in the image display surface may sequentially generate a scan signal, and may sequentially supply the scan signal to the gate lines (GL1~GLn). In addition, the gate drive circuit may generate a light emission control signal, and may supply the light emission control signal to the respective emission lines (EL1~ELn). The gate drive circuit will hereinafter be described with reference to the attached drawings.

As described above, sub-pixels (P) may be arranged on the entire surface of the display panel 100 (i.e., the image display surface of the display panel 100) in a matrix, thereby displaying images. Each sub-pixel (P) may include an organic light emitting diode (OLED) and a switch circuit (SWC) for independently driving the OLED. Arrangement format of the sub-pixels (P) located at the image display surface is not limited only to the matrix, and may be arranged in various forms, for example, a stripe form, a pixel sharing form and a diamond shape, etc.

Figure 2:
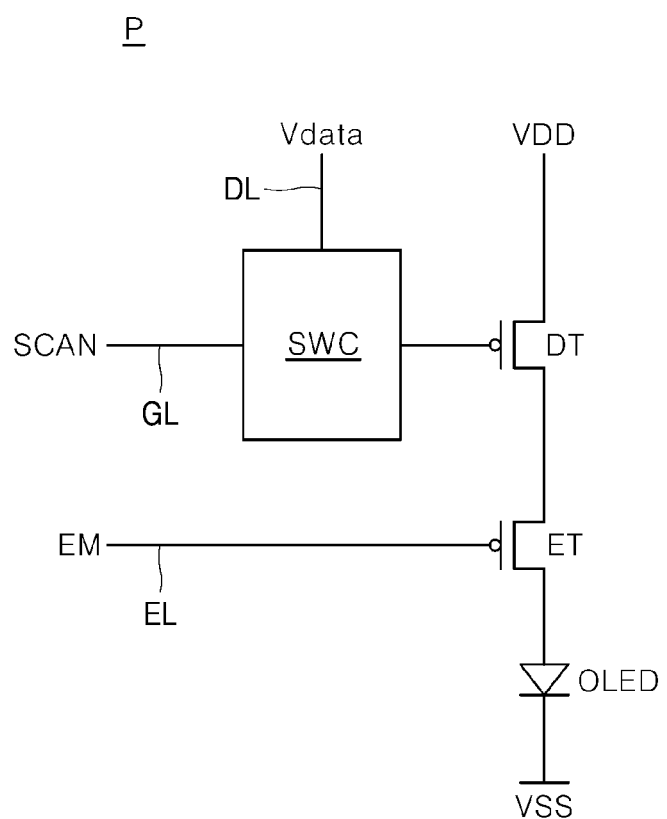
FIG. 2 is a circuit diagram illustrating an equivalent circuit of an OLED pixel shown in FIG. 1.

FIG. 2 is a circuit diagram illustrating an equivalent circuit of an OLED pixel shown in FIG. 1.

Referring to FIG. 2, if the sub-pixel (P) has an OLED pixel structure, each sub-pixel (P) may include an OLED for emitting light by a drive current flowing between a high-potential voltage (VDD) and a low-potential voltage (VSS); a drive thin film transistor (DT) for controlling the amount of drive current applied to the OLED; a switch circuit (SWC) for adjusting a gate voltage of the drive thin film transistor (DT) using a data voltage (Vdata) received from a data line (DL), a scan signal (SCAN) received from a gate line (GL), etc.; and an emission thin film transistor (ET) for turning on or off flow of a current flowing between the drive thin film transistor (DT) and the OLED in response to a light emission control signal (EM) received from an emission line (EL). In this case, an example in which each thin film transistor (TFT) formed in the pixel is implemented as a PMOS thin film transistor (TFT) will hereinafter be described in detail.

Each switch circuit (SWC) may supply an analog data voltage (Vdata) from the data line (DL) to the OLED, and may be charged with the data voltage (Vdata), such that a light emission state of the OLED can be maintained.

The drive IC 200 shown in FIG. 1 may transmit a gate control signal (GCS) to the gate drive circuit, and may supply the data voltage to each of the data lines (DL1~DLn), such that images can be displayed through the respective sub-pixels (P).

In more detail, upon receiving at least one synchronization signal from the external system or the like, the drive IC 200 may convert either digital image data received from the external system or pre-stored digital image data into an analog data voltage (Vdata).

In more detail, the drive IC 200 may subdivide reference gamma voltages having plural levels in a manner that the reference gamma voltages respectively correspond to gray scale values (e.g., 0 to 255) of digital image data segments, and thus generate a gamma voltage set. The drive IC 200 may convert digital image data segments into the analog data voltage (Vdata) using the gamma voltage set. The converted data voltages (Vdata) may be sequentially supplied to the respective data lines (DL1~DLm), such that an image having gray scales corresponding to the data voltages (Vdata) is displayed.

In addition, the drive IC 200 may generate not only a gate control signal (GCS) for controlling an operation time point of the gate drive circuit, but also a plurality of clock pulses (CLKn) using at least one synchronization signal, and may transmit the gate control signal (GCS) and the clock pulses (CLKn) to the gate drive circuit embedded in the display panel 100. The gate control signal (GCS) may further include a plurality of clock pulses (CLKn) having different phases, a gate start signal, a gate shift clock and a gate enable signal, etc.

The gate drive circuit embedded in the image display surface of the display panel 100 may sequentially generate the scan signals (SCAN) for sequentially driving the gate lines (GL1~GLn) using the plurality of clock pulses (CLKn), the gate control signal, etc. The gate drive circuit may sequentially supply the scan signals (SCAN) to the gate lines (GL1~GLn) through respective gate contact electrodes (GPo).

During a time period in which the scan signals (SCAN) are not supplied to the gate lines (GL1~GLn), the gate drive circuit may supply a gate-OFF voltage to the gate lines (GL1~GLn). Therefore, the gate drive circuit may sequentially drive the switch circuits (SWC) connected to the gate lines (GL1~GLn) in units of a gate line (GL).

The respective gate contact electrodes (GPo) may be formed in contact holes through which output terminals of the scan signals (SCAN) of the gate drive circuit embedded in the display panel 100 are electrically connected to the gate lines (GL1~GLn) of the image display surface, respectively.

The gate drive circuit embedded in the image display surface may generate light emission control signals (EM) for driving the emission lines (EL1~ELn) using the plurality of clock pulses (CLKn), the gate control signal (GCS), etc. The gate drive circuit may supply the light emission control signals (EM) to the emission lines (EL1~ELn) through the respective emission contact electrodes (EPo).

The respective emission contact electrodes (EPo) may be formed in contact holes through which output terminals of the light emission control signals (EM) of the gate drive circuit embedded in the display panel 100 are electrically connected to the emission lines (EL1~ELn) of the image display surface, respectively.

Meanwhile, a power-supply unit (not shown) may supply a high-potential voltage (VDD) and a low-potential voltage (GND or VSS) to sub-pixels (P) of the image display surface, the gate drive circuit, and the drive IC 200.

Figure 3:
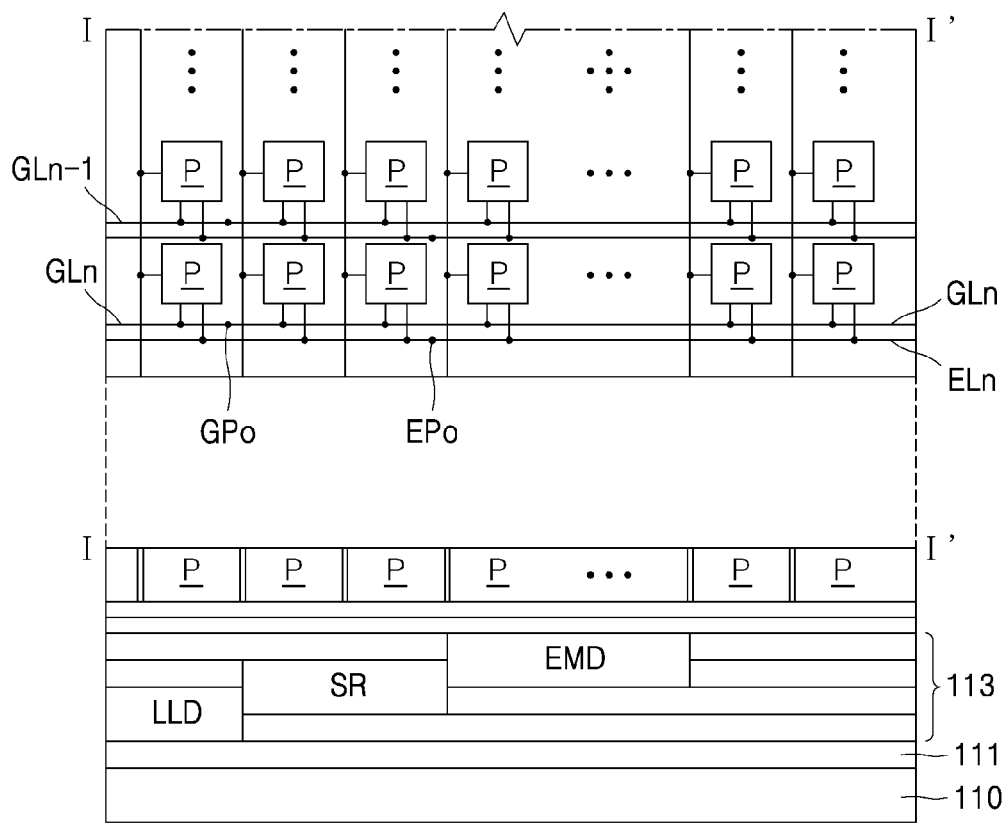
FIG. 3 shows a front view and a cross-sectional view of parts of the display panel including the drive circuit shown in FIG. 1.

FIG. 3 shows a front view and a cross-sectional view of parts of the display panel including the drive circuit shown in FIG. 1.

Referring to the cross-sectional view of the display panel 100 of FIG. 3, the display panel 100 may include a substrate 110, a buffer layer 111, a link line unit (LLD), a gate drive circuit (SR, EMD), and an image display surface on which images are displayed.

The buffer layer 111 may be deposited and constructed over the entire surface of the substrate 110. In this case, the buffer layer 111 can minimize moisture or oxygen penetration through the substrate 110, and can planarize an upper part or the entire surface of the substrate 110. For this purpose, the buffer layer 111 may be formed of an insulation material such as $SiN_x$ and $SiO_2$. The insulation material constructing the buffer layer 111 may be formed not only of $SiN_x$ or $SiO_2$, but also of a passivation material such as $AlO_x$ and $TiO_2$ according to categories of the substrate 110 or TFT categories of the gate drive circuit (SR, EMO), etc. However, the buffer layer 111 can be used in other types of devices other than the OLED device, and the buffer layer 111 may also be omitted as necessary.

The link line unit (LLD) and the gate drive circuit (SR, EMO) may be constructed over the entire surface of the buffer layer 111. In this case, the link line unit (LLD) may transmit the gate control signal (GCS) and the plurality of clock pulses (CLKn) received from the drive IC 200 of the image display surface, and the gate drive circuit (SR, EMO) may generate and output the scan signals for driving the gate lines (GL1~GLn) of the image display surface.

A plurality of metal lines may be patterned and constructed in the link line unit (LLD). The gate drive circuit (SR, EMO) may include a plurality of thin film transistors, and a plurality of insulation layers 113 may be sequentially stacked in a process for constructing the metal lines of the link line unit (LLD) and the thin film transistors of the gate drive circuit (SR, EMO), such that the link line unit (LLD) and the gate drive circuit (SR, EMO) are implemented. If necessary, each of the insulation layers 113 may further include a plurality of interlayer insulation films for adjusting overall planarization and thickness of the display panel.

If an upper part of the plurality of insulation layers 113 including the link line unit (LLD) and the gate drive circuit (SR, EMO) is planarized, the plurality of gate lines (GL1~GLn) and the plurality of gate lines (DL1~DLn) may be arranged to cross each other over the entire surface of the planarized insulation layers 113. A plurality of sub-pixels (P) may be formed in intersection regions of the gate lines (GL1~GLn) and the data lines (DL1~DLn), such that images are displayed on the image display surface.

The gate drive circuit (SR, EMD) may include a shift register (SR) and a light emission register (EMD). The shift register (SR) may generate and output the scan signals (SCAN) for sequentially driving the gate lines (GL1~GLn) using the gate control signal (GCS) and the plurality of clock pulses (CLKn) transmitted through the link line unit (LLD). The light emission register (EMD) may generate and output light emission control signals (EM) for driving the emission lines (EL1~ELn) of the image display surface using the gate control signal (GCS) and the plurality of clock pulses (CLKn) transmitted through the link line unit (LLD).

Each of the shift register (SR) and the light emission register (EMD) may include a plurality of control stages for sequentially outputting the scan signals (SCAN) and the light emission control signals (EM). In other words, the shift register (SR) may include several gate control stages, which are interconnected in a cooperative manner and sequentially output the scan signals (SCAN) according to the gate control signal (GCS) and the plurality of clock pulses (CLKn). The light emission register (EMD) may include several light emission control stages, which are interconnected in a cooperative manner and output the light emission control signals (EM) according to the gate control signal (GCS) and the plurality of clock pulses (CLKn).

Figure 4:
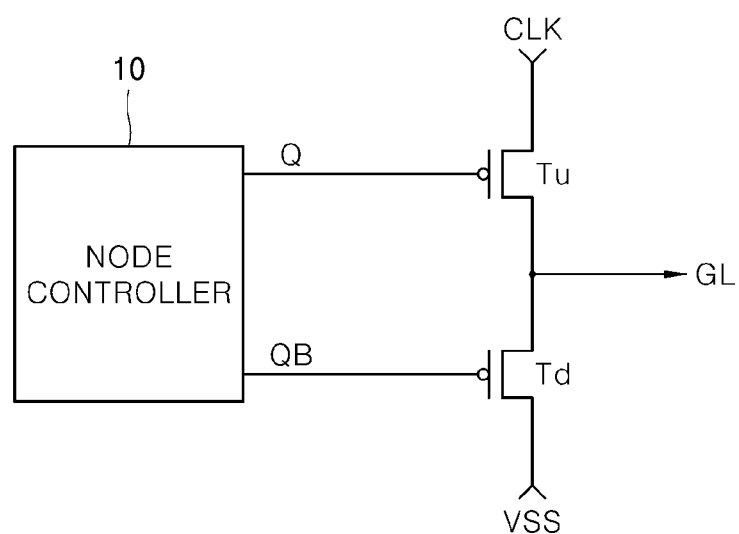
FIG. 4 is a circuit diagram illustrating an equivalent circuit of a gate control stage of a shift register shown in FIG. 3.

FIG. 4 is a circuit diagram illustrating an equivalent circuit of any one gate control stage of the shift register shown in FIG. 3.

Referring to FIG. 4, the gate control stage may include a node controller 10, a pull-up switching element (Tu), and a pull-down switching element (Td). The node controller 10 may control a charging or discharging state of an enable node (Q) and a disable node (QB). The pull-up switching element (Tu) may output the scan signals (SCAN) to the respective gate lines (GL) according to a signal state of the enable node (Q) for controlling a time period in which the scan signals (SCAN) are applied to the respective gate lines (GL). The pull-down switching element (Td) may output a discharging voltage source (VSS) to the respective gate lines (GL) according to a signal state of the disable node (QB) for controlling a time period in which the scan signals (SCAN) are not output to the respective gate lines (GL).

The node controller 10 may include a plurality of switching thin film transistors for controlling charging or discharging of the enable node (Q) and the disable node (QB). Each of the gate control stages may include a plurality of switching thin film transistors, the pull-up switching element (Tu), and a pull-down switching element (Td). Therefore, on the whole, the shift register (SR) and the light emission control register (EMD) may include dozens to hundreds of switching TFTs, pull-up switching elements (Tu), and pull-down switching elements (Td), which are configured to construct a plurality of gates and light emission control stages.

Thus, according to the aspects of the present disclosure, the plurality of switching TFTs, the pull-up switching elements (Tu), and the pull-down switching elements (Td), which are configured to construct the plurality of gates and light emission stages, may be patterned and constructed over the entire surface of the buffer layer 111 of the substrate 110, and the image display surface including the plurality of sub-pixels (P) may be constructed over the entire surface of the plurality of planarized insulation layers 113, height and thickness of which are adjusted through planarization.

For this purpose, the plurality of switching TFTs, the pull-up switching elements (Tu), and the pull-down switching elements (Td), which are configured to construct the shift register (SR) and the light emission control register (EMD), may be formed of LTPS TFTs each having an active layer formed of low temperature polysilicon (LTPS). In order to construct the active layer formed of low temperature polysilicon (LTPS), whereas a high-priced fabrication process such as laser annealing is needed and it is difficult to control characteristics of the active layer, distribution and unbalance phenomenon of a threshold voltage and mobility can be excluded, such that the active layer formed of LTPS can be constructed by reducing the number of mask processes without formation of a separate compensation circuit such as a compensation capacitor. Therefore, in order to embed the plurality of switching TFTs, pull-up switching elements (Tu), and pull-down switching elements (Td) into an interior part or lower part of the image display surface, it is preferable that the number of fabrication processes using the mask be reduced such that the resultant structure can perform simplified and stable operations.

On the other hand, it is preferable that drive TFTs (DT), emission TFTs (ET), and TFTs of the switch circuits (SWC) contained in the sub-pixels (P) of the image display surface be formed of oxide TFTs each having the active layer formed of an oxide material such as polysilicon. If the active layer is formed of the oxide material, a capacitor or compensation circuit for compensating for distribution of a threshold voltage or mobility is additionally needed such that the number of mask processes is increased. However, characteristics of the active layer formed of the oxide material can be easily controlled, and additional high-priced laser annealing is not performed, such that the oxide active layer is beneficial in terms of product costs.

Specifically, the reason why the switching TFTs, the pull-up switching elements (Tu)m and the pull-down switching elements (Td) are formed of LTPS TFTs is to minimize interference encountered when the sub-pixel (P) formed of the oxide TFTs is affected by the shift register (SR) and the light emission register (EMD) formed of LTPS TFTs. In the case where the gate drive circuit formed of LTPS TFTs while being embedded in a lower part of the image display surface affects the sub-pixel (P) composed of the oxide TFTs, the degree of influence of the gate drive circuit upon the sub-pixel (P) is at the highest level in a clock line region in which each of source/drain electrodes has a maximum amplitude and a maximum frequency.

A magnetic field, etc. applied to the sub-pixels (P) of the image display surface may be maximally affected by the link line unit (LLD). The magnetic field, etc. applied to the sub-pixels (P) may be less affected by the shift register (SR) and the light emission control register (EMD) than by the link line unit (LLD). The magnetic field, etc. applied to the sub-pixels (P) may be much less affected by the gate contact electrodes (GPo) and the mission contact electrodes (EPo) than by the shift register (SR) and the light emission control register (EMD). Therefore, if there is no problem in the sub-pixels (P) corresponding to the link line unit (LLD), it is determined that influence caused by the shift register (SR), the light emission control register (EMD), and the like does not much affect the image display operation of the sub-pixels (P). In addition, assuming that current characteristics of the sub-pixels (P) corresponding to the link line unit (LLD) are similar to those of the other sub-pixels (P) contained in a region not overlapped with the remaining gate drive circuits, it is determined that overall image display image quality characteristics of the sub-pixels (P) will be similar to those of the other sub-pixels (P).

Figure 5:
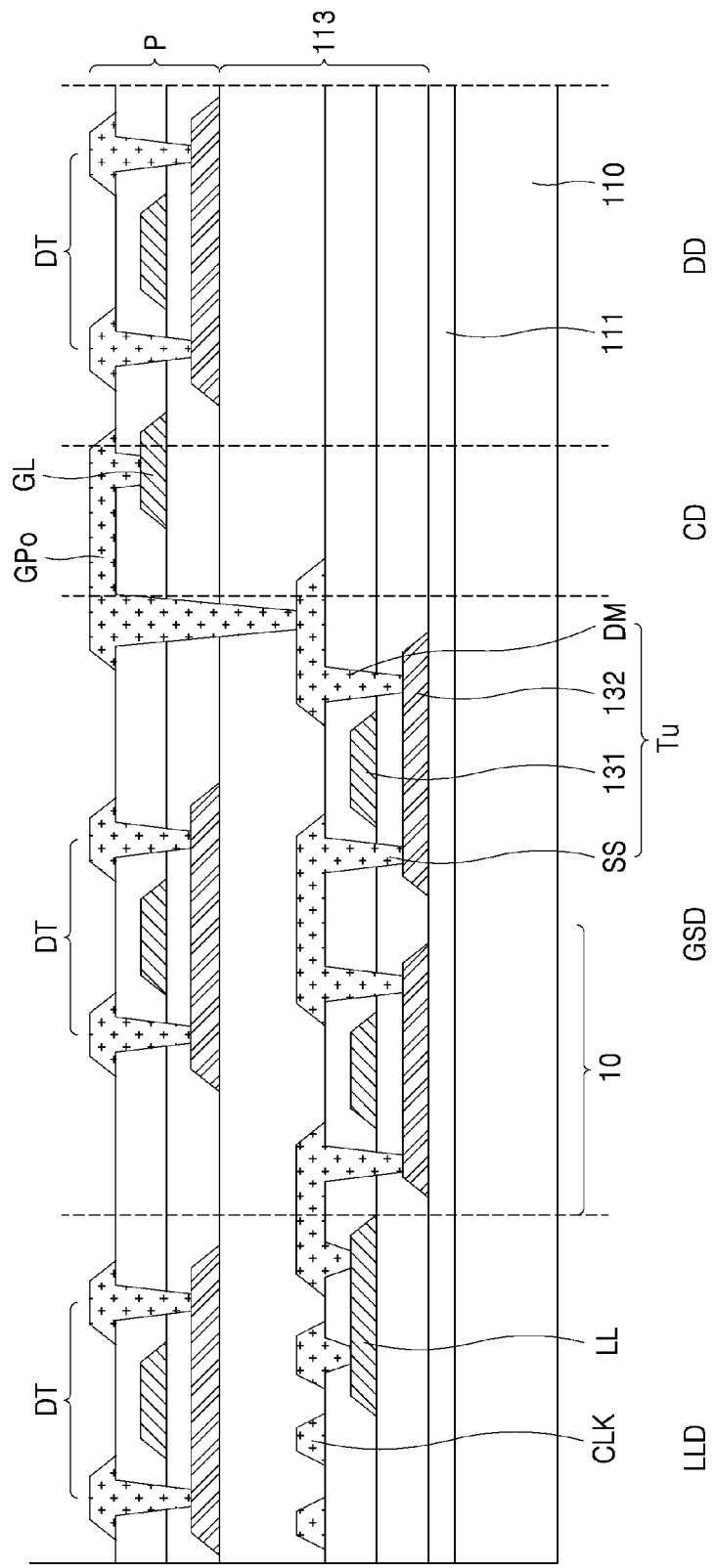
FIG. 5 is a cross-sectional view illustrating parts of a link line unit and a gate control stage configuration region shown in FIG. 3.

FIG. 5 is a cross-sectional view illustrating parts of a link line unit and a gate control stage configuration region shown in FIG. 3.

Referring to FIG. 5, TFTs (DTs) of the sub-pixels (P) may be constructed over the entire image display surface which includes a link line unit (LLD) including a link line (LL), a gate control stage (SR) configuration region, a gate contact electrode configuration region (CD), and a sub-pixel region (DD) composed of only the sub-pixels (P).

As shown in a cross-sectional view of FIG. 5, the plurality of clock lines (CLK), the ink line (LL), the shift register and the light emission control register may be arranged over the buffer layer 111 of the substrate 110.

The plurality of switching TFTs, pull-up switching elements (Tu), and pull-down switching elements (Td), which are configured to construct the shift register SR, may be patterned and constructed over the buffer layer 111 of the substrate 110. Each of the switching TFTs, each of the pull-up switching elements (Tu), and each of the pull-down switching elements (Td) may be constructed to have a coplanar structure. In this case, each TFT may be formed by stacking an active layer 132, a gate electrode 131, a source electrode, and a drain electrode. For example, the active layer 132 may be formed over the buffer layer 111 through LTPS patterning, the gate electrode 131 may be patterned and constructed in a manner that the gate electrode 131 can partially overlap the active layer 132 by the size of a prescribed region on the basis of an insulation layer or protective layer interposed therebetween. In the patterning process of the gate electrode 131, the link lines (LL) of the link line unit (LLD) may be formed of the same conductive material as the gate electrode 131.

In a process for patterning source and drain electrodes (DM) from among the entire process for constructing the switching TFTs, the pull-up switching elements (Tu), and the pull-down switching elements (Td), the link line (LL) may be formed of the same conductive material as the source and drain electrodes (DM).

After all TFTs of the shift register (SR) and the light emission control register (EMD) are patterned and constructed, height and thickness of the constructed TFTs are adjusted and planarized, such that the image display surface including the plurality of sub-pixels (P) may be constructed over the entire surface of the planarized insulation layers 113.

Switching TFTs contained in the switch circuits (SWC) of the sub-pixels (P), the drive TFTs (DT) of the sub-pixels (P), and the emission TFTs (ET) of the sub-pixels (P) may be formed of oxide-semiconductor-type TFTs each having an active layer formed of an oxide semiconductor material. Each of the drive TFTs (DT) or the like may have a bottom gate structure in which a gate electrode, an active layer formed of an oxide semiconductor material, a source electrode, and a drain electrode are sequentially stacked.

Thereafter, the output terminal of the scan signal (SCAN) of the gate drive circuit embedded in the display panel 100 (i.e., the drain electrode (DD) of the pull-up switching element (Tu)) may be provided with a contact hole. The gate contact electrode (GPo) may be provided with a contact hole of the drain electrode (DM) of the pull-up switching element (Tu), such that the drain electrode (DD) of the pull-up switching element (Tu) is electrically connected to the gate line (DL) of the image display surface.

Likewise, output terminals of the light emission control signals (EM) of the gate drive circuit embedded into the display panel 100 may be electrically connected to the respective emission lines (EL1~ELn) through the respective emission contact electrodes (EPo).

The display panel including the drive circuit and the image display apparatus using the same according to the aspects of the present disclosure may allow the gate drive circuit for driving the gate lines (GL1~GLn) of the display panel 100 to be formed of LTPS TFTs, such that the gate drive circuit can be embedded in the internal insulation layer and the LTPS layer of the image display region.

In addition, image display pixels are arranged and constructed over the entire surfaces of the internal insulation layer and the LTPS layer in a manner that the image display pixels overlap the internal insulation layer and the LTPS layer in which the gate drive circuit is embedded, such that a non-display region and a bezel region of the image display panel can be removed.

As is apparent from the above description, the display panel including the drive circuit and the image display device using the same according to the aspects of the present disclosure may allow a gate drive circuit for driving gate lines of an image display panel to be composed of LTPS TFTs, such that the gate drive circuit can be embedded in an internal insulation layer and an LTPS layer of an image display region.

Image display pixels are arranged and constructed over the entire surfaces of the internal insulation layer and the LTPS layer such that the image display pixels overlap the internal insulation layer and the LTPS layer in which the gate drive circuit is embedded, such that a non-display region of the image display panel and a bezel region can be reduced to removed.

The present disclosure described above may be variously substituted, altered, and modified by those skilled in the art to which the present disclosure pertains without departing from the scope and sprit of the present disclosure. Therefore, the present disclosure is not limited to the above-mentioned exemplary aspects and the accompanying drawings.

What is claimed is:

1. A display panel comprising:
   a substrate;
   a plurality of clock lines and a link line disposed at a link line unit on the substrate;
   a plurality of switching elements disposed at a gate drive circuit region on the substrate;
   a plurality of insulation layers covering the plurality of clock lines, the link line, and the plurality of switching elements; and
   an image display side including a plurality of sub-pixels and displaying an image on the plurality of insulation layers,
   wherein the link line unit and the gate drive circuit region are embedded in the plurality of insulation layers, disposed on a different insulation layer among the plurality of insulation layers, and planarized by the plurality of insulation layers, and
   wherein the link line unit and the gate drive circuit region overlap with the image display side.

2. The display panel of claim 1, wherein the gate drive circuit region includes a shift register having a plurality of switching thin film transistors, a pull-up switching element and a pull-down switching element in a coplanar structure.

3. The display panel of claim 1, wherein the plurality of insulation layers where the plurality of sub-pixels is formed has a planarized top surface.

4. The display panel of claim 2, wherein each of the plurality of switching thin film transistors, the pull-up switching element, and the pull-down switching element includes an active layer formed of low temperature polysilicon.

5. The display panel of claim 2, wherein the plurality of sub-pixels includes an oxide thin film transistor having an active layer formed of an oxide material.

6. The display panel of claim 2, wherein the pull-up switching element acting as a scan signal output terminal of the gate drive circuit includes a drain electrode having a contact hole, wherein the drain electrode is electrically connected to a gate line of the image display side through a gate contact electrode formed in the drain electrode contact hole, so that a scan pulse is transmitted to the gate line.

7. The display panel of claim 2, wherein the gate drive circuit region includes:
   a shift register configured to generate and output a plurality of scan signals sequentially driving a plurality of gate lines upon receiving a gate control signal and a plurality of clock pulses transmitted through the plurality of clock lines and the link line; and
   a light emission control register configured to generate and output a plurality of light emission control signals driving emission lines of the image display side upon receiving the gate control signal and the plurality of clock pulses transmitted through the plurality of clock lines and the link line.

8. An image display device including a substrate, comprising:
a display panel having an image display side where a plurality of gate lines and a plurality of data lines cross each other, a plurality of sub-pixels disposed at intersection regions of the gate and data lines and displaying an image on the image display side and a gate drive circuit disposed in the image display side and driving the gate lines;
a link line unit disposed on the substrate;
a drive integrated circuit configured to transmit a gate control signal to the gate drive circuit to control the gate drive circuit and transmit a data voltage to the data lines; and
a power supply unit configured to supply high-potential and low-potential drive voltages to the plurality of sub-pixels of the image display side, the gate drive circuit, and the drive integrated circuit,
wherein the gate drive circuit overlaps with the image display side, and
wherein the link line unit and the gate drive circuit are embedded in a plurality of insulation layers, disposed on a different insulation layer among the plurality of insulation layers, and planarized by the plurality of insulation layers.

9. The image display device of claim 8, wherein the display panel includes:
a plurality of clock lines and a link line disposed at a link line unit on the substrate;
a plurality of switching elements disposed at a gate drive circuit region on the substrate;
a plurality of insulation layers covering the plurality of clock lines, the link line, and the plurality of switching elements; and
an image display side having a plurality of sub-pixels disposed on the plurality of insulation layers and displaying an image thereon.

10. The image display device of claim 9, wherein the gate drive circuit region includes a shift register having a plurality of switching thin film transistors, a pull-up switching element, and a pull-down switching element in a coplanar structure.

11. The image display device of claim 9, wherein the plurality of insulation layers covering the plurality of sub-pixels has a planarized top surface.

12. The image display device of claim 10, wherein the plurality of switching thin film transistors, the pull-up switching element, and the pull-down switching element have an active layer formed of low temperature polysilicon.

13. The image display device of claim 10, wherein the plurality of sub-pixels includes an oxide thin film transistor having an active layer formed of an oxide material.

14. The image display device of claim 10, wherein the pull-up switching element acting as a scan signal output terminal of the gate drive circuit includes a drain electrode having a contact hole, wherein the drain electrode is electrically connected to a gate line of the image display side through a gate contact electrode formed in the drain electrode contact hole, so that a scan pulse is transmitted to the gate line.

15. The image display device of claim 8, wherein the gate drive circuit region includes:

a shift register configured to generate and output a plurality of scan signals sequentially driving a plurality of gate lines upon receiving a gate control signal and a plurality of clock pulses transmitted through the plurality of clock lines and the link line; and
a light emission control register configured to generate and output a plurality of light emission control signals driving emission lines of the image display side upon receiving the gate control signal and the plurality of clock pulses transmitted through the plurality of clock lines and the link line.

16. A display device including a display panel displaying an image on an image display side, comprising:
a plurality of gate lines and a plurality of data lines cross each other;
a plurality of sub-pixels disposed at intersection regions of the gate and data lines;
a plurality of clock lines and a link line disposed at a link line unit;
a shift register configured to generate and output a plurality of scan signals sequentially driving the plurality of gate lines upon receiving a gate control signal and a plurality of clock pulses transmitted through the plurality of clock lines and the link line; and
a light emission control register configured to generate and output a plurality of light emission control signals driving emission lines of the image display side upon receiving the gate control signal and the plurality of clock pulses transmitted through the plurality of clock lines and the link line;
a plurality of insulation layers covering the plurality of clock lines, the link line, the shift register and light emission control register; and
a power supply unit supplying high-potential and low-potential drive voltages to the plurality of sub-pixels and the shift register and light emission control register,
wherein the plurality of clock lines, the link line, the shift register and light emission control register are embedded in the plurality of insulation layers, disposed on a different insulation layer among the plurality of insulation layers, and planarized by the plurality of insulation layers, and
wherein the plurality of clock lines, the link line, the shift register and light emission control register overlap with the image display side.

17. The display device of claim 16, wherein the shift register includes a plurality of switching thin film transistors, a pull-up switching element, and a pull-down switching element in a coplanar structure.

18. The display device of claim 16, wherein the plurality of insulation layers covering the plurality of sub-pixels has a planarized top surface.

19. The display device of claim 17, wherein the plurality of switching thin film transistors, the pull-up switching element, and the pull-down switching element have an active layer formed of low temperature polysilicon.

20. The display device of claim 16, wherein the plurality of sub-pixels includes an oxide thin film transistor having an active layer formed of an oxide material.

21. The display device of claim 17, wherein the pull-up switching element acting as a scan signal output terminal of the gate drive circuit includes a drain electrode having a contact hole, wherein the drain electrode is electrically connected to a gate line of the image display side through a gate contact electrode formed in the drain electrode contact hole, so that a scan pulse is transmitted to the gate line.

* * * * *